US007282425B2

(12) United States Patent
Koester et al.

(10) Patent No.: US 7,282,425 B2
(45) Date of Patent: Oct. 16, 2007

(54) STRUCTURE AND METHOD OF INTEGRATING COMPOUND AND ELEMENTAL SEMICONDUCTORS FOR HIGH-PERFORMANCE CMOS

(75) Inventors: Steven John Koester, Ossining, NY (US); Devendra Kumar Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 11/046,912

(22) Filed: Jan. 31, 2005

(65) Prior Publication Data

US 2006/0172505 A1    Aug. 3, 2006

(51) Int. Cl.
H01L 21/30 (2006.01)
H01L 21/46 (2006.01)

(52) U.S. Cl. .............................. 438/455; 257/E21.049; 257/E21.088; 257/E21.218; 257/E27.035

(58) Field of Classification Search ................. 438/455
See application file for complete search history.

(56) References Cited

U.S. PATENT DOCUMENTS

| | | | | | |
|---|---|---|---|---|---|
| 4,622,093 | A | * | 11/1986 | Tsang | 117/107 |
| 4,769,341 | A | * | 9/1988 | Luryi | 117/105 |
| 4,872,040 | A | * | 10/1989 | Jackson | 257/198 |
| 4,987,095 | A | * | 1/1991 | Batey et al. | 438/393 |
| 5,204,283 | A | * | 4/1993 | Kitagawa et al. | 438/509 |
| 5,262,347 | A | * | 11/1993 | Sands | 228/208 |
| 5,374,564 | A | | 12/1994 | Bruel | |
| 5,783,477 | A | * | 7/1998 | Kish et al. | 438/455 |
| 5,966,620 | A | * | 10/1999 | Sakaguchi et al. | 438/455 |
| 5,985,739 | A | * | 11/1999 | Plettner et al. | 438/455 |
| 6,235,606 | B1 | * | 5/2001 | Huang et al. | 438/400 |
| 6,323,108 | B1 | * | 11/2001 | Kub et al. | 438/458 |
| 6,372,356 | B1 | * | 4/2002 | Thornton et al. | 428/469 |
| 6,399,473 | B1 | * | 6/2002 | Fischer et al. | 438/602 |
| 6,563,143 | B2 | | 5/2003 | Gao et al. | |
| 6,594,293 | B1 | | 7/2003 | Bulsara et al. | |
| 6,946,371 | B2 | * | 9/2005 | Langdo et al. | 438/481 |

(Continued)

OTHER PUBLICATIONS

P.M.J Maree et al. Silicon Strained Layers Grown on GaP (001) by Molecular Beam Epitaxy; American Institute of Physicis; J. Appl. Phys. 58,(8), Oct. 15, 1985; pp. 3097-3103.

Djula Eres et al., Heteroepitaxial Growth of Ge Films on (100) GaAs by pyrolysis of Digermane, American Institute of Physics; Appl Phys. Lett. 55 (9), Aug. 28, 1989, pp. 858-860.

(Continued)

Primary Examiner—Walter Lindsay, Jr.
Assistant Examiner—Thu-Huong Dinh
(74) Attorney, Agent, or Firm—Keusey, Tutunjian & Bitetto, P.C.; Anne V. Dougherty, Esq.

(57) ABSTRACT

A method for fabricating a semiconductor substrate includes epitaxially growing an elemental semiconductor layer on a compound semiconductor substrate. An insulating layer is deposited on top of the elemental semiconductor layer, so as to form a first substrate. The first substrate is wafer bonded onto a monocrystalline Si substrate, such that the insulating layer bonds with the monocrystalline Si substrate. A semiconductor device includes a monocrystalline substrate, and a dielectric layer formed on the monocrystalline substrate. A semiconductor compound is formed on the dielectric layer and an elemental semiconductor material formed in proximity of the semiconductor compound and lattice-matched to the semiconductor compound.

6 Claims, 7 Drawing Sheets

U.S. PATENT DOCUMENTS

| | | | |
|---|---|---|---|
| 6,977,203 B2 * | 12/2005 | Hshieh et al. | 438/268 |
| 6,995,456 B2 * | 2/2006 | Nowak | 257/627 |
| 7,042,105 B2 * | 5/2006 | Hartwell et al. | 257/786 |
| 7,045,432 B2 * | 5/2006 | Orlowski et al. | 438/300 |
| 7,078,160 B2 * | 7/2006 | Brask et al. | 430/316 |
| 2004/0045499 A1 * | 3/2004 | Langdo et al. | 117/84 |
| 2005/0045995 A1 * | 3/2005 | Ieong et al. | 257/627 |

OTHER PUBLICATIONS

S. Strite et al.; Antiphase domain free growth of GaAs on Ge in GaAs/Ge/GaAs: American Institute of Physics; Appl. Phys. Lett. 56 (3), Jan. 1990; pp. 244-246.

S.M. Ting et al,; Metal-organic chemical vapor deposition of single domain GaAs on Ge/GexSi1-x/Si and Ge substrates; American Institute of Physics; Journal of Appl Physics, vol. 87, No. 5, Mar. 1, 2000; pp. 2618-2628.

* cited by examiner

STRUCTURE AND METHOD OF INTEGRATING COMPOUND AND ELEMENTAL SEMICONDUCTORS FOR HIGH-PERFORMANCE CMOS

BACKGROUND

1. Technical Field

Exemplary embodiments described herein relate to semiconductors and, more particularly, to integrated compound and elemental semiconductor substrates and devices.

2. Description of the Related Art

Compound semiconductors, particularly III-V semiconductors, are of interest for advanced complementary metal oxide semiconductor (CMOS) technology, due to their superior transport properties compared to silicon (Si). However, the superior transport only applies to electrons. In III-Vs, the hole mobility is only comparable or even degraded compared to elemental semiconductors, such as Si and Ge.

One method for combining III-V and group-IV materials is described by G. B. Gao and H. H. Hoang in U.S. Pat. No. 6,563,143, wherein a method of combining GaAs and Ge, for NFETs and PFETs, respectively, has been proposed. The combination of materials is particularly attractive because GaAs and Ge are lattice matched, and Ge has the highest hole mobility of any known semiconductor. However, the method proposed in Gao and Hoang has several problems. First of all, that method utilizes GaAs direct growth on a Si substrate, which produces poor quality GaAs with large defect densities arising from the roughly 4% lattice mismatch between GaAs and Si. Furthermore, any time a compound semiconductor is grown on an elemental semiconductor, anti-phase domains are a potential problem. The problem occurs at the atomic steps on the surface of the elemental semiconductor.

Referring to FIG. 1, when a compound semiconductor is grown, a sub-lattice inversion can occur at the step boundaries. These anti-phase domains can be electrically active, and could lead to device degradation or even failure. FIG. 1 shows an anti-phase boundary (APB). Though methods to remove anti-phase domains have been proposed, they involve complicated techniques such as growth on miscut substrates (S. Strite et al., Appl. Phys. Lett. vol. 56, 244 (1990)) that would be desirable to avoid.

M. Bulsara and E. A. Fitzgerald in U.S. Pat. No. 6,594,293 additionally describe the concept of bonding a III-V semiconductor layer to Si or $SiO_2$ substrates to form III-V-on-insulator structures, but utilized III-V growth on Ge layers which, in turn, were formed on Si wafers using a compositional grading technique. This technique once again has the problem of anti-phase domains, and has the added problem that the starting material has a high defect density due to the lattice mismatch between the III-V layer and the original Si substrate.

Demonstrations of growing elemental semiconductors on a compound semiconductor have been shown (See, e.g., D. Eres et al., Appl. Phys. Lett. vol. 55, 858 (1989) and P. M. J. Maree et al., vol. 58, 3097 (1985)). However, a way of integrating the two materials onto a Si substrate has not been proposed.

SUMMARY

It would be advantageous to develop a method of combining compound semiconductors and elemental semiconductors to achieve the best combination of electron and hole transport properties for high-performance CMOS. Furthermore, it would also be preferable for the combined compound/elemental semiconductor system to be on a Si substrate, so as be to compatible with standard CMOS processing and wafer handling equipment. Furthermore, it would be preferable for the combined compound/elemental semiconductor system to have low defect density and be free of anti-phase domains.

The problem of how to integrate compound semiconductors and elemental semiconductors for high-performance CMOS applications is addressed herein. Methods for combining compound and elemental semiconductors onto a monocrystalline substrate in such a way as to obtain high-quality material and avoid the problem of anti-phase domains in the compound semiconducting material are disclosed. One solution is achieved by epitaxially growing an elemental semiconductor on a single-crystal compound semiconductor substrate and then using wafer bonding to transfer the combined compound and elemental semiconductor layer structure onto a single-crystal substrate. These methods, among other things, solve the problem of anti-phase domains, because they avoid altogether compound semiconductor growth on an elemental semiconductor. These methods also enable high-quality films for both the compound and elemental semiconductors to be realized because bulk compound semiconductor crystals have low defect densities relative to layers produced by direct or compositionally graded growth of Ill-Vs on Si.

Exemplary embodiments also provide device structures, which utilize compound semiconductor and elemental semiconductors monolithically integrated on a Si substrate. The devices include compound and elemental semiconductors arranged in both stacked and side-by-side configurations. For example, a structure permits GaAs-channel NFETs and Ge-channel PFETs on a Si substrate to be combined with conventional Si CMOS. A structure is also provided whereby III-V semiconductors can act as a gate dielectric for elemental semiconductors.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present disclosure describes exemplary embodiments for methods and devices, which combine compound and elemental semiconductors onto a silicon (Si) substrate in such a way as to avoid the problem of anti-phase domains in the compound semiconducting material.

The one concept is to epitaxially grow an elemental semiconductor on a single-crystal compound semiconductor substrate and then use wafer bonding to transfer the combined compound and elemental semiconductor layer structure onto a Si substrate. This methodology solves the problem of anti-phase domains, because it avoids altogether compound semiconductor growth on an elemental semiconductor.

This method also creates high-quality films for both the compound and elemental semiconductors because bulk compound semiconductor crystals have low defect densities relative to layers produced by direct growth or compositional growth on Si.

The teachings of this disclosure could apply to any compound/elemental semiconductor group; however, the Gallium Arsenide/Germanium (GaAs/Ge) combination may be particularly useful for future high-performance complementary metal oxide semiconductor (CMOS) applications. It is therefore to be understood that the materials referenced herein and in the FIGS. are for illustrative purposes only. Other materials and material combinations, which include similar chemical characteristics or structure, may be substituted for the specific elements and compounds described and shown through out the specification and FIGS.

Figure 1:
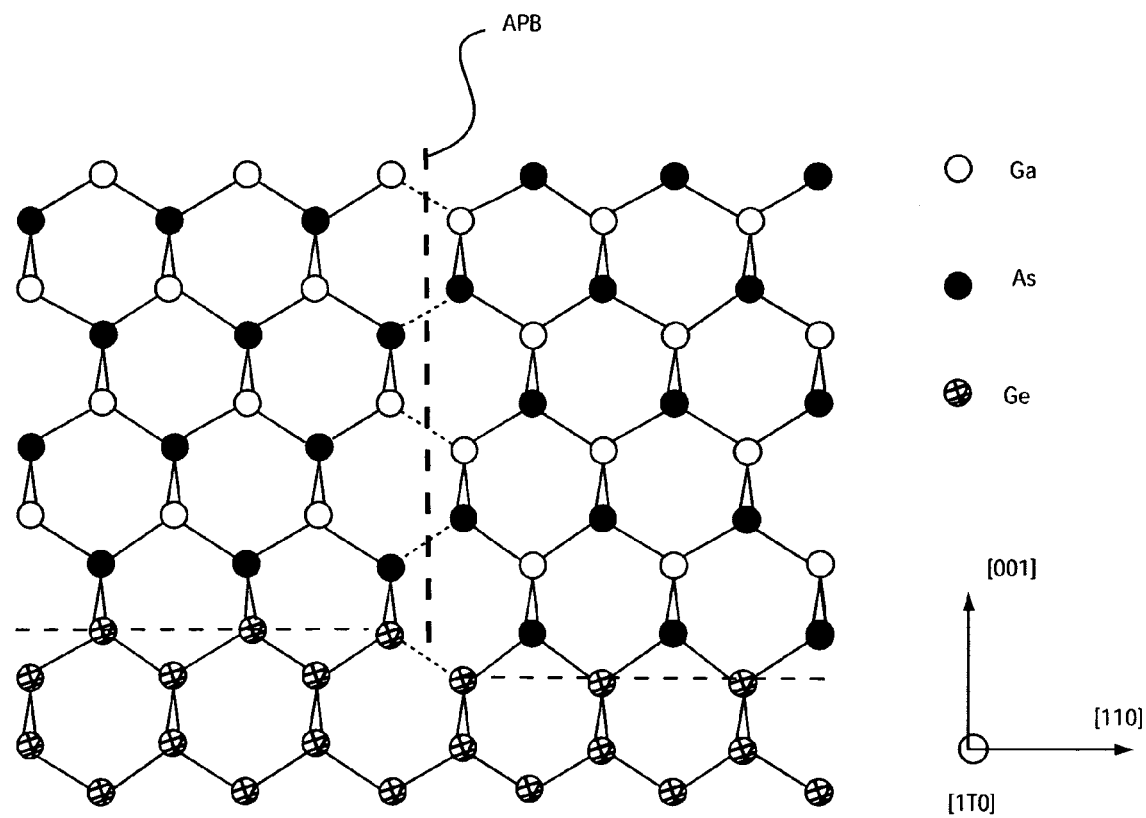
FIG. 1 is a diagram showing anti-phase domain formation in a compound semiconductor grown on an elemental semiconductor (see, e.g., S. M. Ting and E. A. Fitzgerald, J. Appl. Phys. vol. 87, 2618, 2000.)
Figure 2:
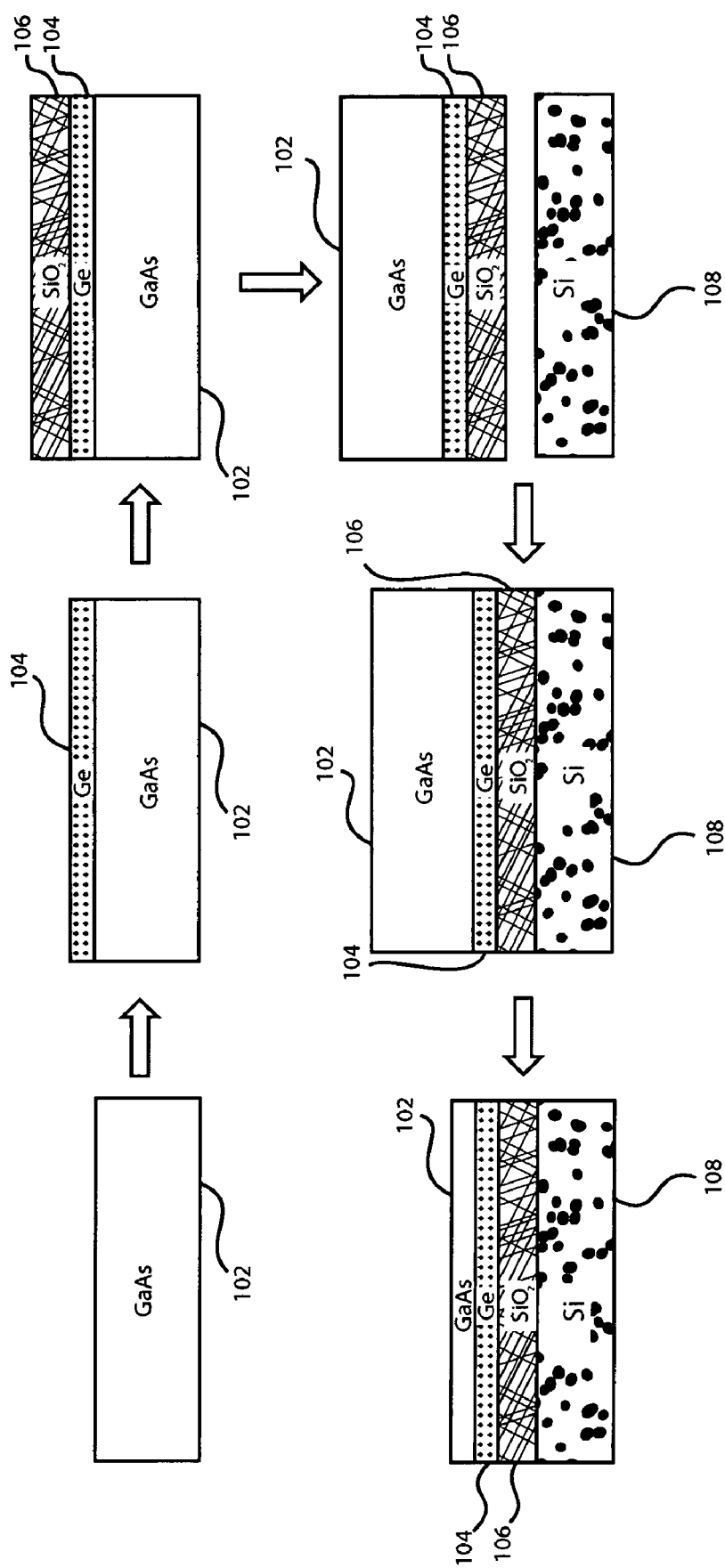
FIG. 2 illustratively shows a method for one embodiment where an elemental semiconductor is grown on a bulk compound semiconductor substrate and then transferred onto a Si substrate using wafer bonding.

Referring now in detail to the figures in which like numerals represent the same or similar elements and initially to FIG. 2, an illustrative implementation of a method in accordance with this disclosure is shown. The method preferably begins with a single-crystal III-V wafer 102, e.g., GaAs. The single crystal may include other III-V elements as well. Next, a single-crystal elemental semiconductor 104 is grown epitaxially on top of wafer 102. Elemental semiconductor 104 may include, e.g., Ge. Optionally, an amorphous insulating layer 106 may be deposited on top of the elemental semiconductor 104, and then flipped and bonded to a handle wafer 108, which is preferably silicon. In order to promote the formation of a strong bond, additional surface treatments and smoothing may also be utilized to improve bond strength and uniformity.

Bonding of dielectric layer 106 may be performed by placing dielectric layer 106 and handle wafer 108 in direct contact, followed by a subsequent annealing step. In this way, a direct fusion bond is formed based upon van der Waals attractive forces. In a preferred embodiment, an anneal is performed to strengthen the bond, preferably at temperatures high enough to create sufficient bond strength to withstand subsequent thinning, but low enough to prevent destruction of the compound semiconductor wafer due to the differing coefficients of thermal expansion between compound semiconductor wafer 102 and handle wafer 108. Temperatures in the range of 100° C. to 400° C. may be preferable. After thinning III-V wafer 102, a higher temperature anneal can be performed to further strengthen the bond.

Alternately, the insulating layer 106 may be deposited directly onto the Si handle wafer 108, or the insulating layer may be eliminated altogether. In one embodiment, the insulating layer 106 may be formed on both the wafer 108 and the elemental layer 104 such that portions of the insulating layer 106 are employed to create the bonding of the two substrates. Amorphous insulating layer 106 may include an oxide or nitride, preferably silicon dioxide.

Wafer 102 is thinned either using a wafer splitting method such as the Smart-cut technique (U.S. Pat. No. 5,374,564, incorporated herein by reference), or thinned directly, by polishing, etching or a combination thereof. Thinning of wafer 102 may be made easier by utilizing an etch-stop layer such as AlAs or the like before the initial growth of the elemental layer 104. In another method, ion implantation is used to create a damaged region within the compound semiconductor layer after deposition of the insulating layer 106. Then, after bonding, thermal annealing is used to separate the majority of the compound semiconductor substrate. The separation anneal could be performed concurrently, or separately from the bond strengthening anneal described earlier.

In one example, the elemental semiconductor layer 104 may include a thickness of between about 5 and about 100 nm, and the compound semiconductor 108 includes a thickness of between about 2 and about 100 nm. The elemental semiconductor layer 104 is preferably lattice-matched to the compound semiconductor 108, and more preferably under 4% lattice mismatch.

Figure 3:
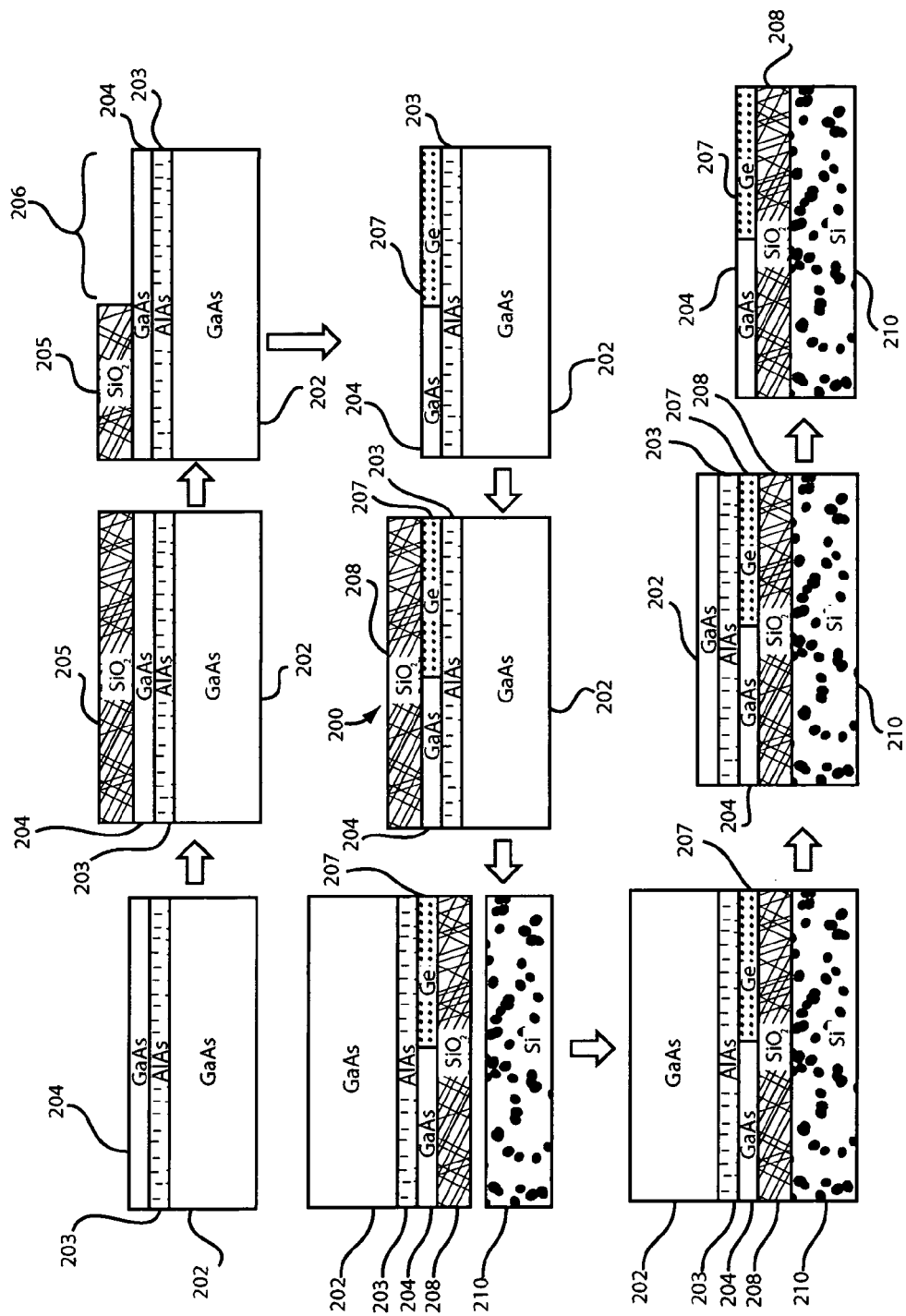
FIG. 3 illustratively shows another embodiment where side-by-side layers of compound and elemental semiconductors are transferred onto a substrate using wafer bonding.

Another embodiment creates side-by-side compound and elemental semiconductor regions on a monocrystalline Si substrate. Referring to FIG. 3, an illustrative method using, e.g., GaAs and Ge materials is shown. Beginning with a substrate 202, which may include a GaAs substrate, a buried etch stop layer 203 is optionally formed followed by an additional film 204, preferably of substrate material (202) or similar properties of substrate material (202). Etch stop layer 203 may include, e.g., AlAs. One or more regions of the sample are masked off using an appropriate technique such as deposition of a dielectric film 205 and etch back to form a region 206. This process may include employing photolithography or other methods and using an etching process portions of layers 204 and 205 are removed to expose the etch stop layer 203.

An elemental semiconductor 207, e.g., Ge, is grown in the exposed area (region 206) to a thickness approximately the same as film 204. The remaining portions of layer 204 are removed (preferably by a selective etching process.

Next, an insulating dielectric 208, which is preferably silicon dioxide, is deposited and smoothed using a planarization technique, such as chemical-mechanical polishing (CMP). In this case, the dielectric 208 is needed to smooth the surface of sample 200 for bonding. The sample 200 is flipped and bonded to ha handle wafer 210, preferably a silicon wafer.

Bonding may be performed by placing dielectric layer 208 and handle wafer 210 in direct contact, followed by a subsequent annealing step. In this way, a direct fusion bond may be formed based upon van der Waals attractive forces. In one preferred embodiment, a subsequent anneal is formed to strengthen the bond, preferably at temperatures high enough to create sufficient bond strength, but low enough to prevent destruction of the compound semiconductor wafer due to differing coefficients of thermal expansion. Temperatures in the range of 100° C. to 400° C. are preferable.

Next, a portion of substrate 202 is removed using, e.g., a wafer splitting, an etch back polish etc. Whichever method is used, if the etch stop layer 203 is utilized, the remaining layer 202 and etch stop layer 203 can easily be removed by using an appropriate selective etch. After thinning III-V wafer 202, a higher temperature anneal can be performed to further strengthen the bond. In this embodiment, a particularly useful structure of side-by-side, high-quality compound and elemental semiconductor layers on a Si substrate is created.

In some embodiments, the elemental semiconductor 207 may include one of SiGe, SiGeC, or Ge, the compound semiconductor substrate (202) may include GaAs, the etch stop layer 203 may include AlGaAs, and the second layer 204 includes GaAs or InGaAs.

The elemental semiconductor layer 207 is preferably lattice-matched to the second layer of compound semiconductor 204, and more preferably under 4% lattice mismatch.

In accordance with the exemplary embodiments of the present disclosure, the side-by-side, elemental and high-quality compound layer may be employed to form a plurality of different useful components. These components may include active or passive components. The structure may be employed, for example, to form CMOS transistors, diodes, capacitors, resistors and/or devices with junctions.

In one particularly useful embodiment, field-effect transistors (FET) are built upon the final structures shown in FIGS. 2 and 3. One such embodiment is illustratively shown in FIG. 4.

Figure 4:
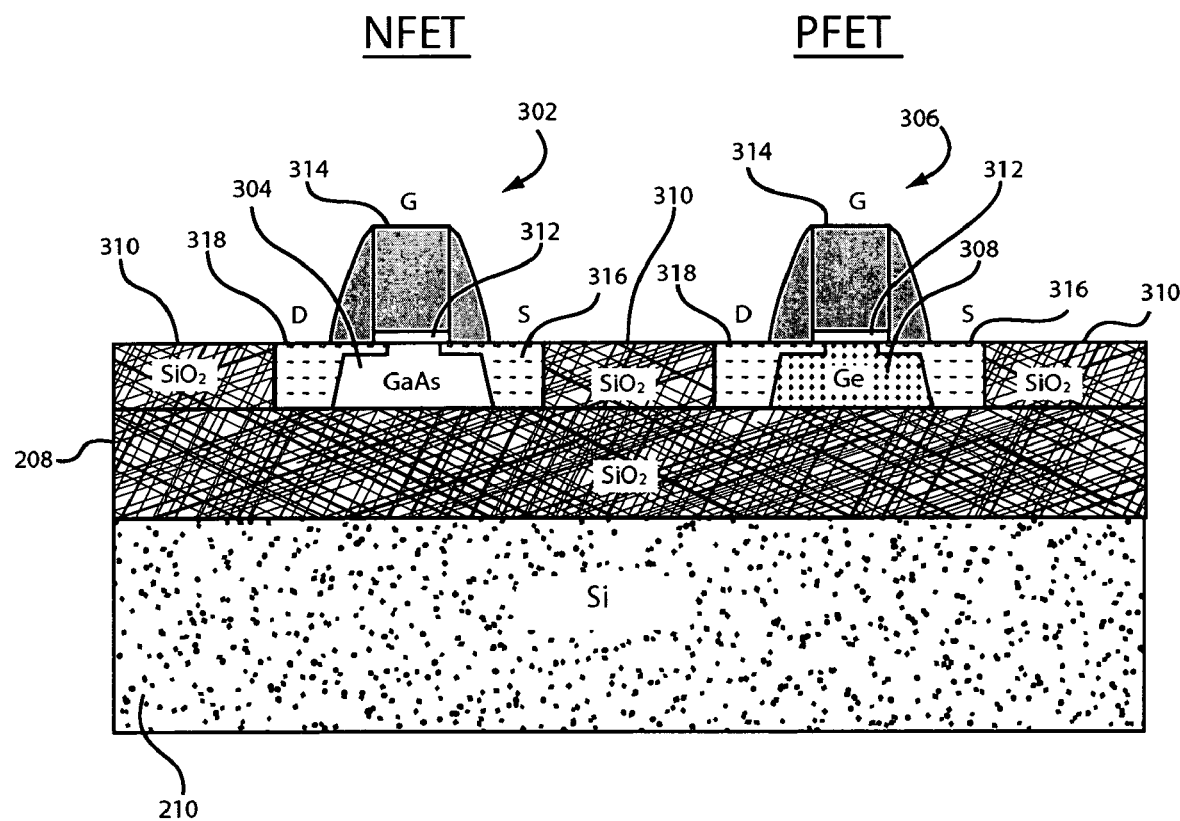
FIG. 4 is a cross-sectional view of a mixed compound and elemental semiconductor CMOS circuit fabricated in accordance with one exemplary embodiment.

Referring to FIG. 4, an n-doped FET (NFET) 302 is fabricated on the region including a high quality compound 304 (e.g., GaAs) and a p-doped FET (PFET) 306 is fabricated on the region including an elemental material 308 (e.g., Ge) in accordance with particularly useful embodiments. In this way, the NFET 302 can benefit from the advantageous electron transport properties in GaAs., while the PFET 306 benefits from the advantageous hole transport in Ge. The FETs 302 and 306 include isolation regions 310 (e.g., $SiO_2$), an insulating gate dielectric 312, a gate (G) electrode 314 and source (S) 316 and drain (D) 318 contact regions.

As mentioned previously, other materials besides GaAs and Ge could be used for the above embodiments of the invention, and in principle any combination of compound and elemental semiconductors may be employed, provided that epitaxial growth of the elemental semiconductor is possible. Examples of other possible combinations of materials for CMOS applications are illustratively shown in Table 1.

TABLE 1

| Elemental | Compound |
|---|---|
| Si, $Si_{1-y}C_y$, $Si_{1-x}Ge_x$ or $Si_{1-x}Ge_xC_y$ (x < 50%) | GaP or AlP |
| $Si_{1-x}Ge_x$ or $Si_{1-x}Ge_xC_y$ (x > 50%) | GaAs |
| Ge | $In_xGa_{1-x}As$ (0 < x < 30%) |

The combinations and listing of materials in Table 1 is not exhaustive and is provided as a way of illustrating alternative combinations and material sets. The embodiments are not limited to a single elemental semiconductor grown on a single compound semiconductor, but may include multiple layers of both the elemental and compound semiconductors.

For example a SiGe/Ge/SiGe quantum well structure may be grown on a GaAs/InGaAs/AlGaAs heterostructure and then transferred using the procedure shown above. In this way, a Ge quantum well (for holes) may be combined with an InGaAs quantum well (for electrons). This would permit even greater mobility enhancement for both the electron and hole systems.

In other particularly useful embodiments, an epitaxial insulating gate dielectric may be enabled for CMOS applications. This would be especially useful in, for example, an AlGaP/Si system, since AlGaP could potentially act as a high-K gate dielectric for a Si MOSFET. This structure has the additional advantage that since the Si is grown epitaxially on the AlGaP substrate, the resulting gate oxide interface could be atomically smooth and reduce interface roughness scattering that severely degrades the mobility in standard $Si/SiO_2$ structures.

Figure 5:
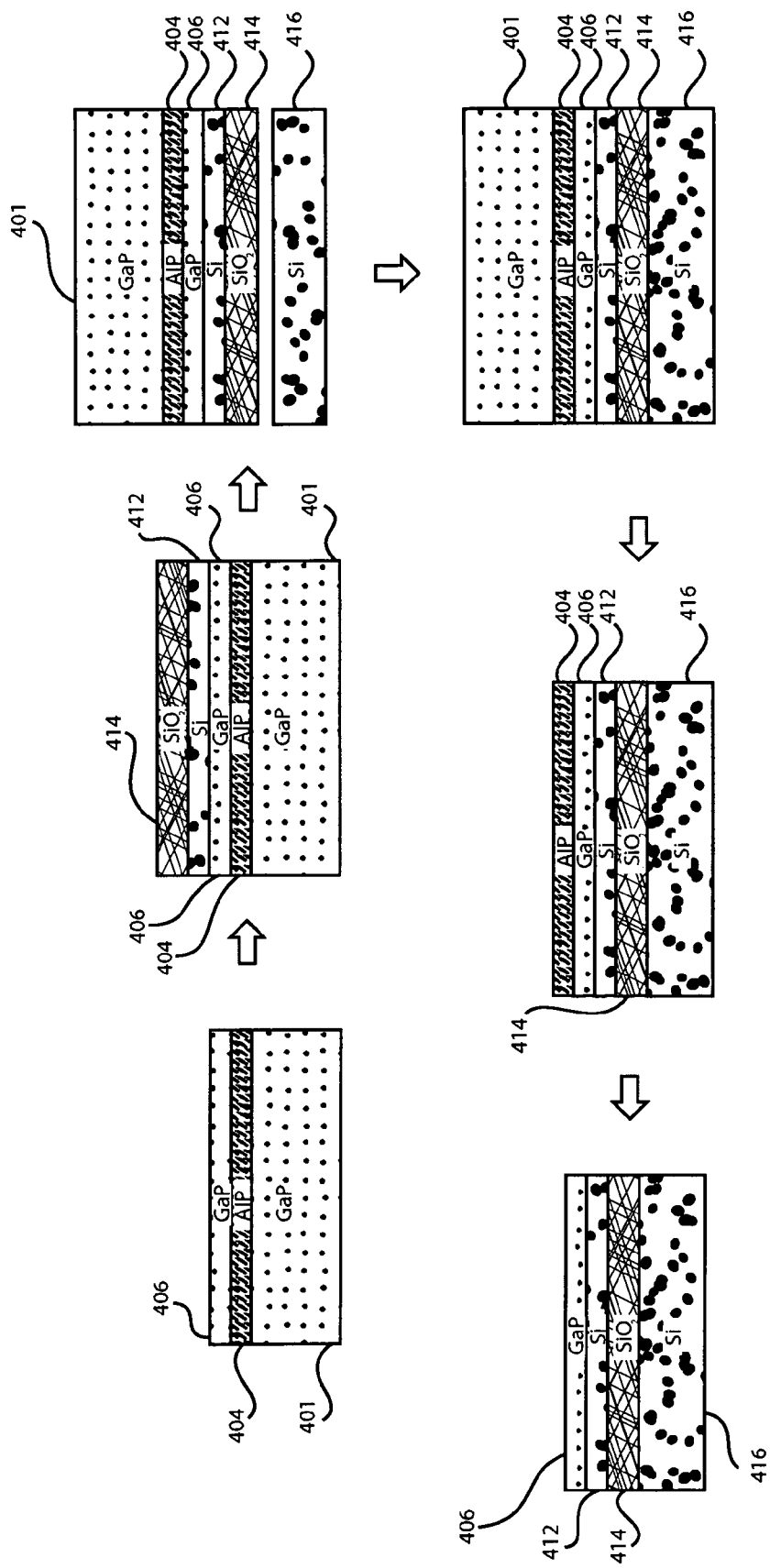
FIG. 5 shows another exemplary method where an elemental semiconductor is grown on a compound semiconductor and transferred to a substrate so that the compound semiconductor acts as a gate dielectric for a transistor device.
Figure 6:
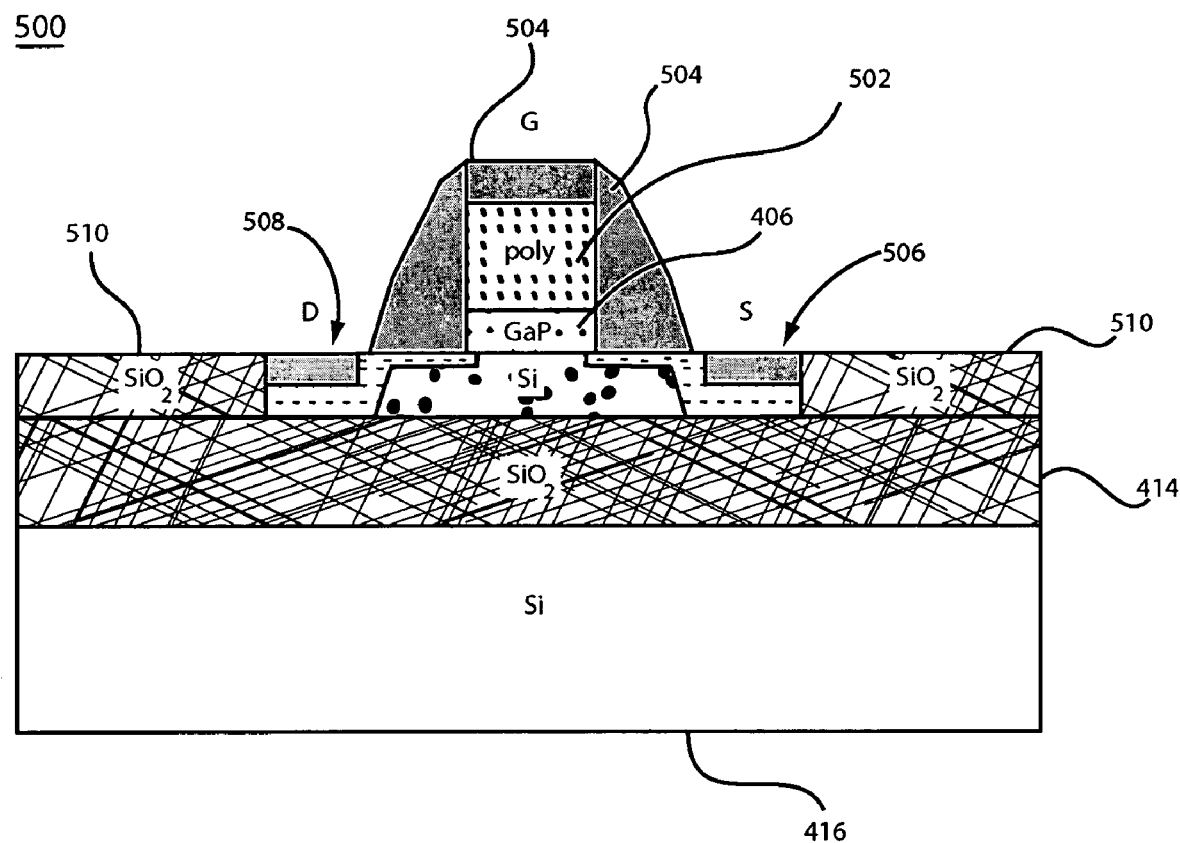
FIG. 6 is a cross-sectional view of a transistor device made in accordance with the method of FIG. 5.

Referring to FIG. 5, an illustrative method for one possible embodiment for fabricating an insulating gate dielectric structure is shown. FIG. 6 shows an illustrative completed MOSFET structure 500.

In this embodiment, an etch stop layer 404 (e.g., AlP), is formed on a substrate 401, (e.g., a GaP substrate) and is used to control the thickness of a gate dielectric layer 406 (see also FIG. 6). Gate dielectric layer 406 may include, e.g., $Ga_{1-x}Al_xP$ An epitaxially grown layer 412, e.g., Si, is formed on dielectric layer 406 followed by a dielectric layer 414, such as silicon dioxide. Dielectric layer 414 is then contacted and bonded (as described above) to a substrate 416, e.g., a silicon substrate and flipped.

Layer 401 is then removed preferably by etching followed by the removal of etch stop layer 404, which may be performed by selective etching. Further processing yields the structure shown in FIG. 6.

Referring to FIG. 6, MOSFET structure 500 includes a gate (G) having gate dielectric layer 406, a gate conductor 502 (e.g., polysilicon or poly) and gate insulation 504. Source (S) contact 506 and drain (D) contact 508 are formed. Isolation dielectric 510 (e.g., silicon dioxide) is also formed and patterned. Optionally, the device structure could incorporate an additional dielectric layer, for example, $SiO_2$ or $HfO_2$, between compound semiconducting dielectric layer 406 and polysilicon layer 502 to reduce gate leakage current.

The embodiments described herein may be combined in different ways. For example, a monolithically integrated standard bulk Si CMOS may be combined with the hybrid compound/elemental CMOS described above and shown in FIG. 4. In one embodiment, the structure in FIG. 3 would be fabricated. Then, a protective dielectric layer or mask layer may be deposited on the entire sample. Next, in selected areas of the wafer, the protective dielectric layer, and the compound/elemental layers (e.g., the GaAs and Ge layers), and the buried dielectric (e.g., $SiO_2$) layer would be removed. Si would be selectively regrown in the recessed area, such that its thickness would be approximately level with the top of the GaAs and Ge layers, which were removed from that area. CMOS devices could then be fabricated in the two different regions using processes appropriate for the different materials.

Figure 7:
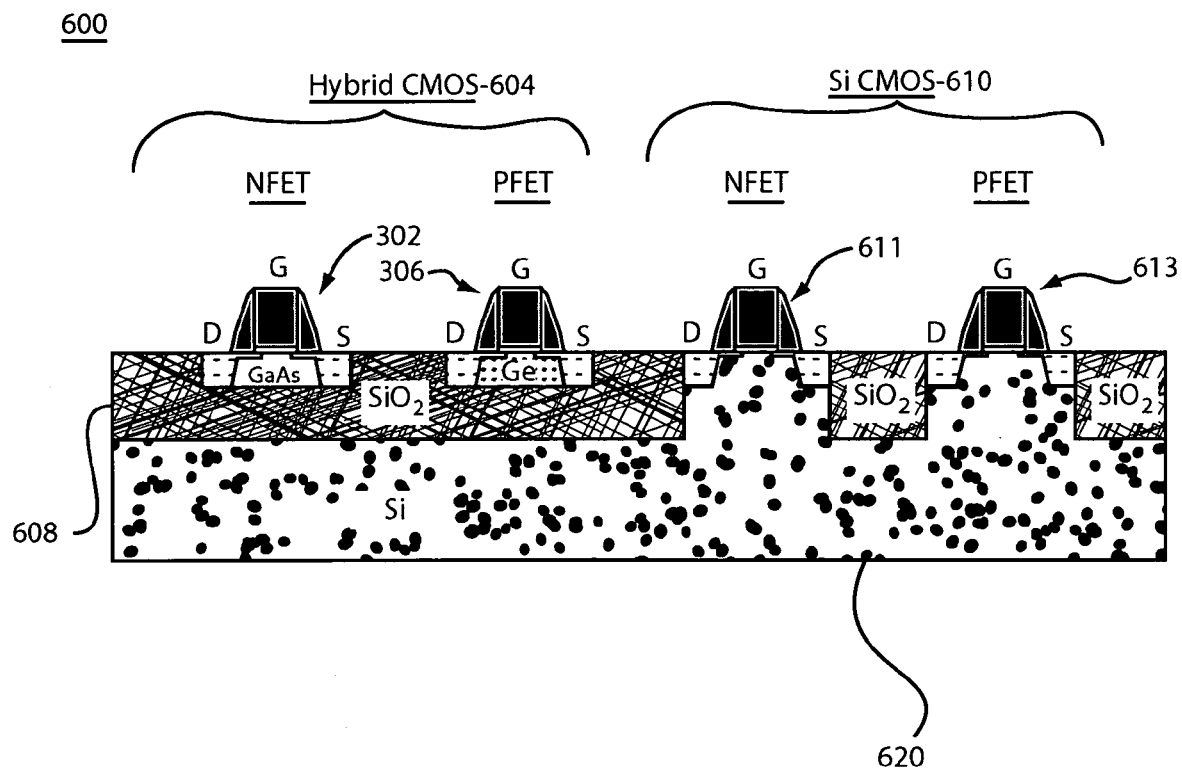
FIG. 7 shows another exemplary embodiment where a mixed compound and elemental semiconductor CMOS circuit is integrated with conventional bulk Si CMOS.

Referring to FIG. 7, a structure 600 of one such embodiment is illustratively shown. In this embodiment, a "hybrid" CMOS device 604 may include a GaAs NFET 302 and a Ge PFET 306 and would utilize a buried insulator 608, and a CMOS device 610 may include bulk Si NFETs 611 and PFETs 613. A bulk silicon substrate 620 is advantageously used in both areas 604 and 610.

One advantage of this embodiment includes that the embodiment permits the hybrid CMOS 604 to be utilized for the tasks where high performance is needed, while still permitting standard 610 CMOS to be used for tasks where yield and low power consumption are needed, but not necessarily ultimate performance.

It is to be understood that the substrates formed in accordance with the present methods (e.g., the last step shown in FIGS. 2, 3 and 5 may be sold and provided directly to semiconductor fabricators or may be provided as initial processing during the manufacture of component structures such as depicted in FIGS. 4, 6 and 7.

Having described preferred embodiments for structures and methods of integrating compound and elemental semiconductors for high-performance CMOS (which are intended to be illustrative and not limiting), it is noted that modifications and variations can be made by persons skilled in the art in light of the above teachings. It is therefore to be understood that changes may be made in the particular embodiments disclosed which are within the scope and spirit of the embodiments described as outlined by the appended claims. Having thus described aspects and details particularity required by the patent laws, what is claimed and desired protected by Letters Patent is set forth in the appended claims.

What is claimed is:

1. A method of fabricating a semiconductor substrate comprising the steps of:
    forming a compound semiconductor substrate having a bulk material, a first layer on top of the bulk material and a second layer on top of the first layer formed of the bulk material;
    forming a third layer of a non-crystalline material on top of the second layer;
    removing a portion of the third layer and the second layer down to the first layer;
    epitaxially growing an elemental semiconductor layer on the first layer adjacent to a remaining portion of the second layer, such that a height of the elemental semiconductor layer is substantially the same as the remaining portion of the second layer;
    removing the third layer;
    forming an insulating layer over the second layer and the elemental semiconductor layer to form a first substrate; and
    wafer bonding the first substrate onto a monocrystalline substrate, such that the insulating layer bonds to the monocrystalline substrate.

2. The method as recited in claim 1, further comprising the step of removing the bulk material and the first layer of the compound semiconductor substrate.

3. The method as recited in claim 1, wherein after the step of forming an insulating layer over the second layer and the elemental semiconductor layer to form a first substrate the step of planarizing the insulating layer is performed.

4. The method as recited in claim 1, wherein the insulating layer includes portions formed on the first substrate and on the monocrystalline substrate and the step of wafer bonding includes bonding the portions of the insulating layer.

5. The method as recited in claim 1, wherein said elemental semiconductor is substantially lattice-matched to the compound semiconductor substrate.

6. The method as recited in claim 1, wherein the elemental semiconductor includes at least one of SiGe, SiGeC, or Ge, the compound semiconductor substrate includes GaAs, the first layer includes AlGaAs, and the second layer includes GaAs or InGaAs.

* * * * *

UNITED STATES PATENT AND TRADEMARK OFFICE
CERTIFICATE OF CORRECTION

PATENT NO. : 7,282,425 B2 Page 1 of 1
APPLICATION NO. : 11/046912
DATED : October 16, 2007
INVENTOR(S) : Koester et al.

It is certified that error appears in the above-identified patent and that said Letters Patent is hereby corrected as shown below:

Column 8, claim 6, line 33, change "AlGaAs" to --AlGaAs--

Signed and Sealed this

Eighteenth Day of December, 2007

JON W. DUDAS
*Director of the United States Patent and Trademark Office*